(12) United States Patent
Kim

(10) Patent No.: US 7,173,321 B2
(45) Date of Patent: Feb. 6, 2007

(54) SEMICONDUCTOR PACKAGE HAVING MULTIPLE ROW OF LEADS

(75) Inventor: Jung-il Kim, Changwon-si (KR)

(73) Assignee: Samsung Techwin Co. Ltd. (KR)

( * ) Notice: Subject to any disclaimer, the term of this patent is extended or adjusted under 35 U.S.C. 154(b) by 17 days.

(21) Appl. No.: 11/103,938

(22) Filed: Apr. 12, 2005

(65) Prior Publication Data

US 2005/0233500 A1    Oct. 20, 2005

(30) Foreign Application Priority Data

Apr. 16, 2004    (KR) ...................... 10-2004-0026247

(51) Int. Cl.
*H01L 23/495* (2006.01)
*H05K 5/02* (2006.01)

(52) U.S. Cl. ...................... 257/668; 257/670; 257/690; 257/773; 257/E23.031; 257/E23.043; 361/813

(58) Field of Classification Search ...................... None
See application file for complete search history.

(56) References Cited

U.S. PATENT DOCUMENTS 6,229,200 B1 * 5/2001 Mclellan et al. ............ 257/666
6,489,218 B1 * 12/2002 Kim et al. .................. 438/460
6,720,207 B2 * 4/2004 Minamio et al. ........... 438/123
6,888,228 B1 * 5/2005 Mostafazadeh et al. ..... 257/666
7,042,071 B2 * 5/2006 Minamio et al. ........... 257/670
7,049,177 B1 * 5/2006 Fan et al. ................... 438/123
7,109,572 B2 * 9/2006 Fee et al. .................... 257/672
2002/0153596 A1 * 10/2002 Tsubosaki et al. .......... 257/666

FOREIGN PATENT DOCUMENTS

JP    2003078094 A  *  3/2003

* cited by examiner

*Primary Examiner*—Alonzo Chambliss
(74) *Attorney, Agent, or Firm*—Tuchman & Park LLC

(57) ABSTRACT

Provided is a method of producing a semiconductor package including at least two rows of leads in which the leads of each row separately connecting a semiconductor chip to an external substrate. The method includes: forming a lead frame, the lead frame including a die pad and a plurality of leads arranged about the die pad; attaching an adhesive tape to a surface of the lead frame covering at least substantially the die pad and the plurality of leads; removing portions of the leads and the adhesive tape disposed in a dividing region and thereby separating at least some of the plurality of leads to form multiple rows of leads; and mounting a semiconductor chip on the die pad, electrically connecting the semiconductor chip with the lead frame, and molding the lead frame and the semiconductor chip to provide a semiconductor package. The adhesive tape attached at undesirable locations of the lead frame is preferably removed after provision of the semiconductor package.

5 Claims, 10 Drawing Sheets

SEMICONDUCTOR PACKAGE HAVING MULTIPLE ROW OF LEADS

BACKGROUND OF THE INVENTION

This application claims priority of Korean Patent Application No. 10-2004-0026247, filed on Apr. 16, 2004, in the Korean Intellectual Property Office, the disclosure of which is incorporated herein in its entirety by reference.

1. Field of the Invention

The present invention relates to a method of manufacturing a semiconductor package having a lead frame with multiple rows of leads arranged about a semiconductor chip of the semiconductor package.

2. Description of the Related Art

As semiconductor chips become more highly integrated, the number of input/output terminals for electrically interconnecting a semiconductor chip to an external PCB needs to be greatly increased. Accordingly, continuing research efforts have been made to develop a semiconductor package having a great number of leads, for example, at least two rows of leads arranged around the semiconductor chip in which the leads of each row are separately connected to a semiconductor chip and an external substrate.

FIG. 1 is a flowchart illustrating a conventional method of manufacturing a semiconductor package. A base lead frame is first fabricated to form the desired shape of the lead frame (that is, operation S10). For example, a plurality of small apertures are formed between leads of the lead frame by stamping or etching while also forming structural elements such as dam-bars, rails or outer frames, or the like. The lead frame is often pre-plated, for example, with Ni, Pd, and Au plating layers (operation S20). Thus, a subsequent solder plating process for applying lead-solder on the lead frame can be omitted by this pre-plating process in which the lead frame is coated with the plating layers having an excellent solder-wettability before performing a semiconductor molding process.

Thereafter, an adhesive tape is attached to a surface of the lead frame (operation S30). By attaching the adhesive tape to at least one surface (e.g., a rear surface) of the lead frame, the lead frame can be kept in a planar shape in a subsequent semiconductor molding process, and a mold flashing phenomenon can be reduced, which is a problem such that molding material flows on the surface of the lead frame.

Next, as a semiconductor packaging process, the semiconductor chip is attached to a die pad of the lead frame, and plural terminals of the semiconductor chip are connected to the multiple rows of leads with wires, and the semiconductor chip, wires, and internal leads are then sealed with insulators such as thermosetting plastics (operation S40). Thereafter, the adhesive tape is removed from the lead frame (operation S50).

In an effort to provide semiconductor packages with a great number of leads, a lead frame with multiple rows of leads arranged around the die pad has been suggested. In order to make such a semiconductor package, each of the leads formed unitarily in operation S10 is now subjected to a separation or individualization process (operation S60). This is a process in which leads of neighboring rows are separated (individualized) by removing the lead portions between the leads of neighboring rows. This process of individualizing leads of neighboring rows has been suggested to be performed after the semiconductor packaging (i.e., molding) process. This individualization process (as a post packaging process) is difficult to perform and requires additional manufacturing costs. In addition, coherence in the bonding surfaces between the molding material and the lead frame may be damaged because this process is performed as a post molding process.

SUMMARY OF THE INVENTION

The present invention provides a method of producing a semiconductor package having multiple rows of leads in which the leads are separated in a pre-molding process, thus effectively providing a semiconductor device with increased number of I/O terminals while streamlining the cumbersome post-packaging process.

The present invention also provides a method of producing a semiconductor package having at least two rows of leads while ensuring an excellent lead planarity (flatness) and reducing a mold flashing effect known in the art. A lead frame for the semiconductor package and manufacturing method of the lead frame is also provided.

According to one aspect of the present invention, there is provided a method of manufacturing a semiconductor package having multiple rows of leads, in which the method comprises: forming a lead frame in which the lead frame includes a die pad and a plurality of leads arranged about the die pad; attaching an adhesive tape to a surface of the lead frame covering at least substantially the die pad and the plurality of leads; removing portions of the leads and the adhesive tape disposed in a dividing region and thereby separating at least some of the plurality of leads to form multiple rows of leads; and mounting a semiconductor chip on the die pad, electrically connecting the semiconductor chip with the lead frame, and molding the lead frame and the semiconductor chip to provide a semiconductor package. The method further preferably comprises removing the adhesive tape attached at undesirable locations of the lead frame after provision of the semiconductor package.

According to another aspect of the present invention, there is provided a lead frame for a semiconductor package having multiple rows of leads, in which the lead frame comprises: an outer frame formed of a conductive material; a die pad disposed adjacent to a central portion of the outer frame; a plurality of leads extending from the outer frame and arranged about the die pad, at least some of the plurality of leads being separated in a dividing region and thereby defining at least two rows of leads; and an adhesive sheet attached at a lower surface of the lead frame covering at least substantially the die pad and the plurality of leads except the dividing region of the leads.

According to the present invention, since a post packaging process is streamlined, manufacturing costs can be reduced. In addition, planarity of the leads can be enhanced and reliable semiconductor packages can be provided. A semiconductor package having more than two rows of leads can be produced effectively.

Also, electrical shorts between leads can be prevented by removing leads located in a dividing region in a state in which the adhesive tape exactly covers the leads in the different rows.

BRIEF DESCRIPTION OF DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Hereinafter, the present invention is described more in details with reference to the accompanying drawings, in which exemplary embodiments of the invention are shown.

Figure 1:
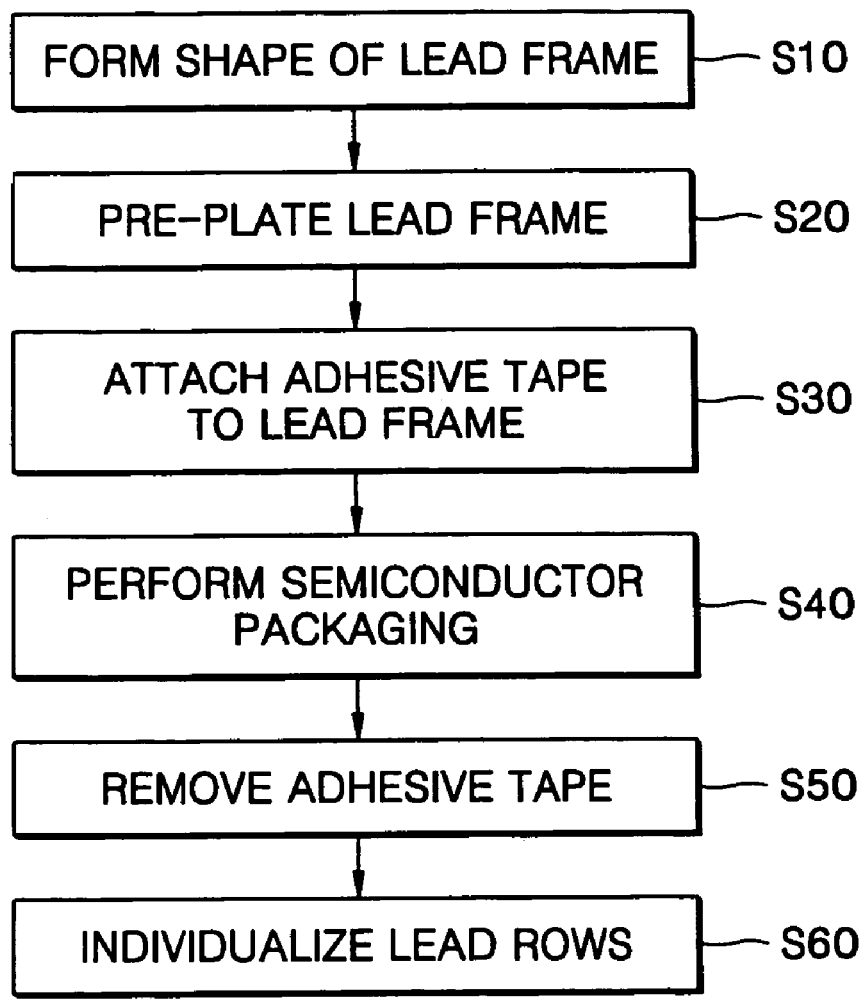
FIG. 1 is a flowchart illustrating a conventional method of manufacturing a semiconductor package having multiple rows of leads.
Figure 2:
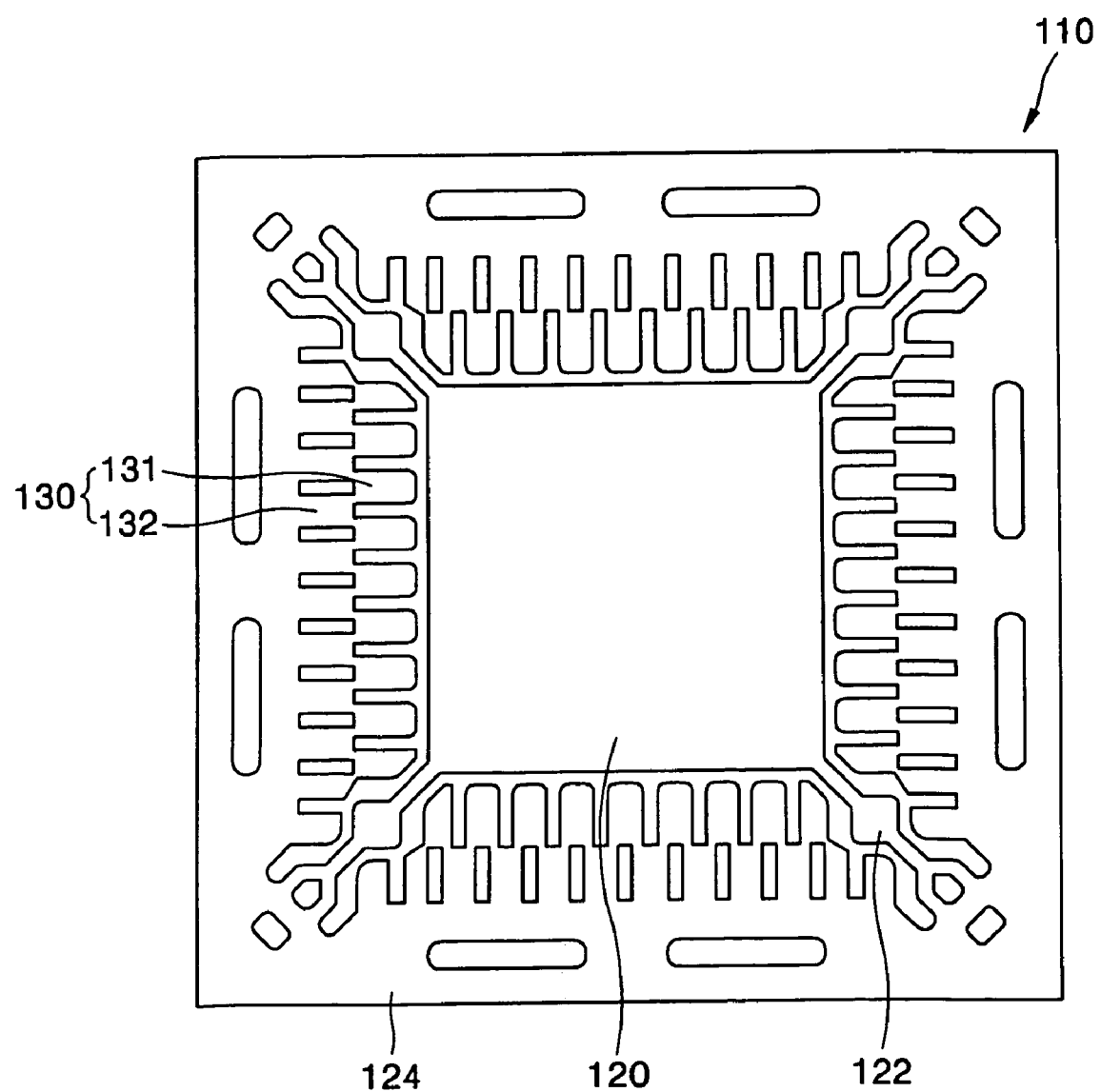
FIG. 2 is an enlarged top view illustrating one example of a lead frame having multiple rows of leads arranged around a die pad.

FIG. 2 shows an example of a lead frame for a semiconductor package, which includes two rows of leads. The lead frame includes a die pad 120 configured to mount a semiconductor chip thereon, and two rows of leads 130 arranged about the die pad 120. The die pad 120 is connected to an outer flame 124 by a pad supporter (a so-called tie bar) 122 and supports the semiconductor chip thereon.

The leads 130 include first rows of leads 131 and second rows of leads 132, each of the leads adapted to electrically connect the semiconductor chip to an external substrate (e.g., a PCB) as an input/output terminal. When an assembly process of the semiconductor package is completed, the outer frame 124 is to be removed.

Figure 3:
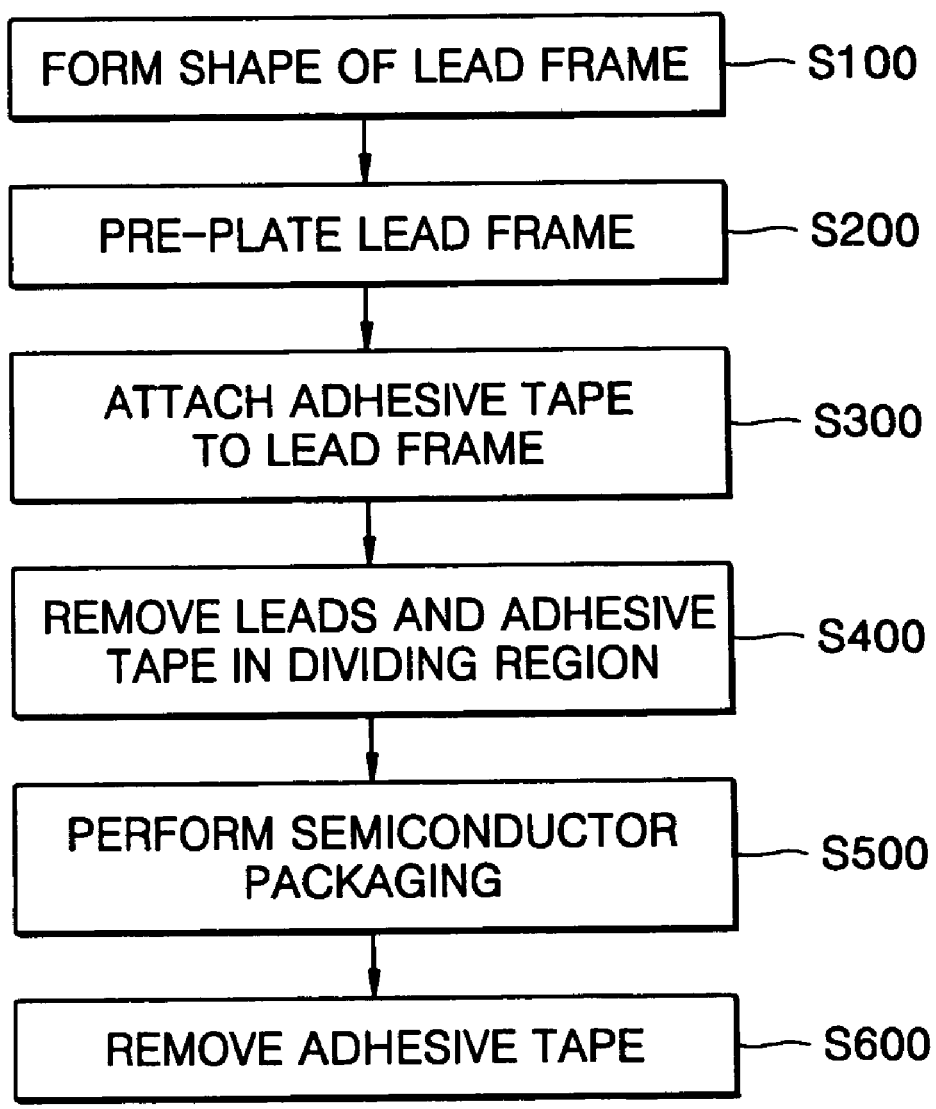
FIG. 3 is a flowchart illustrating a method of manufacturing a semiconductor package having multiple rows of leads according to one embodiment of the present invention.

FIG. 3 is a flowchart illustrating a method of manufacturing a semiconductor package having multiple rows of leads such as that illustrated in FIG. 2, according to one embodiment of the present invention. FIGS. 4A through 4F are cross-sectional views illustrating, as an example, the method of manufacturing the semiconductor package in association with the steps as summarized in the flowchart of FIG. 3.

A semiconductor package to be produced according to the present invention is formed with a lead frame which has multiple rows of leads. For example, as shown in FIGS. 4E and 4F, a semiconductor package can have two rows of leads 130, the first and second rows of leads respectively arranged around a die pad 120. The semiconductor package further includes a semiconductor chip 105 placed on the die pad 120, wires 140 for electrical connection of the chip 105 and the leads 130, and plastic or insulating material 150 sealed around the chip and at least the upper portion of the leads 130. The leads 130 of the semiconductor package are to be electrically connected to an external substrate such as a PCB.

The method of manufacturing the semiconductor package of the invention typically includes a lead frame forming operation S100, a taping operation S300, a multiple-row forming operation S400 by removing portions of the leads, a semiconductor packaging operation S500, and a tape removing operation S600.

Figure 4A:
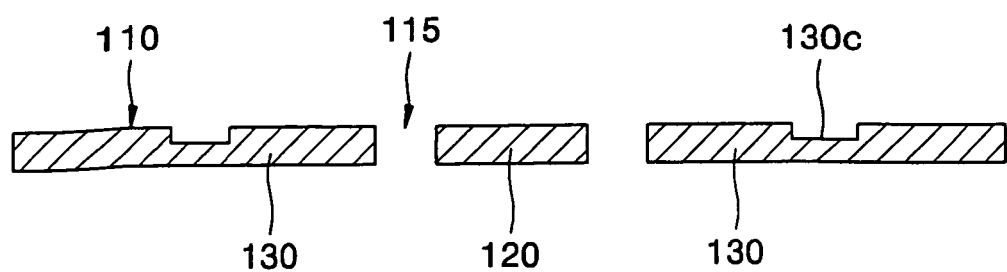
FIGS. 4A through 4F are enlarged cross-sectional views illustrating the method of manufacturing the semiconductor package having multiple rows of leads according to the embodiment as in FIG. 3.

Referring to FIGS. 3 and 4A, by the lead frame forming operation S100, lead frame 110 is formed to have a die pad 120 and a plurality of leads 130 by metal works such as stamping or etching with a metallic base sheet of the lead frame 110. The metal sheet is composed of a conductive metal material such as copper (Cu), nickel (Ni), or iron (Fe). Suitably-shaped apertures 115 are formed between the leads 130 of the lead frame 110 and between the leads 130 and the die pad 120 by etching or stamping the metal sheet. In this operation, each of the leads 130 of the lead frame 110 is formed unitarily (i.e., in a manner that each of the leads 130 in two adjacent rows are connected to each other). The leads 130 in the adjacent rows will be separated by a subsequent operation S400 which will be described later.

Figure 4B:
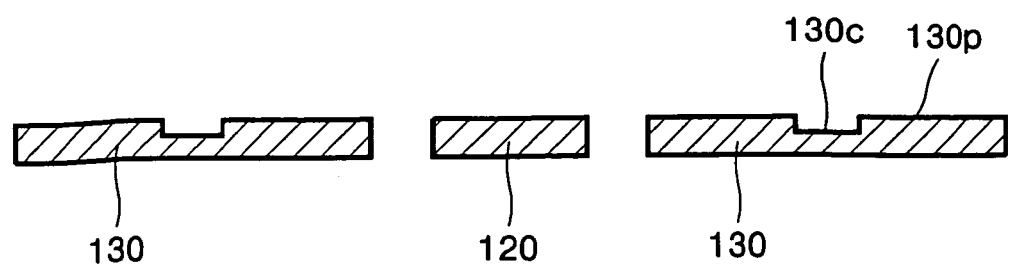

The method of manufacturing the semiconductor package of the invention preferably (but not necessarily) includes a pre-plating operation S200 which is performed after the lead frame formation operation S100. Referring to FIGS. 3 and 4B, in the pre-plating operation S200, a plurality of plating layers 130p typically composed of Ni, Pd, Au, and Ag are formed on the lead frame. As stated above, the plating layers 130p has an excellent solder wettability, and the conventional lead-solder application process can advantageously be omitted from a post molding process. This makes the post-molding process relatively simple, and environmental pollution problems due to the lead (Pb) application process can effectively be eliminated.

Figure 4C:
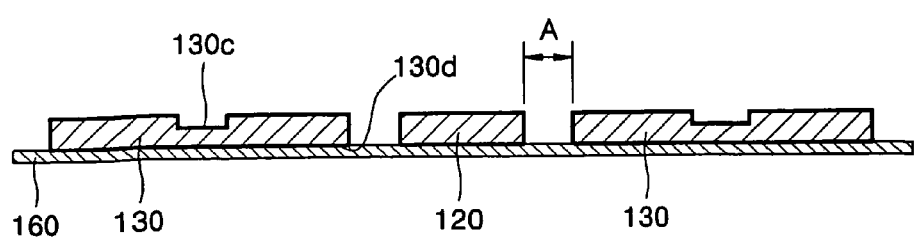

Referring to FIGS. 3 and 4C, an adhesive tape 160 is then attached on a surface of the lead frame 110 (operation S300). The adhesive tape 160 attached on the lead frame secures the leads and can prevent the lead frame 110 from being partially distorted or bent. This may also prevent the mold material from flashing out to the leads in a subsequent molding operation. Because the adhesive tape 160 remains inside the semiconductor package, it should have a heat-resistant property in order to endure the thermal stresses in the packaging process. The adhesive tape 160 should also have an excellent adhesive property, electrical reliability, and suitable other properties for the purposes.

Figure 4D:
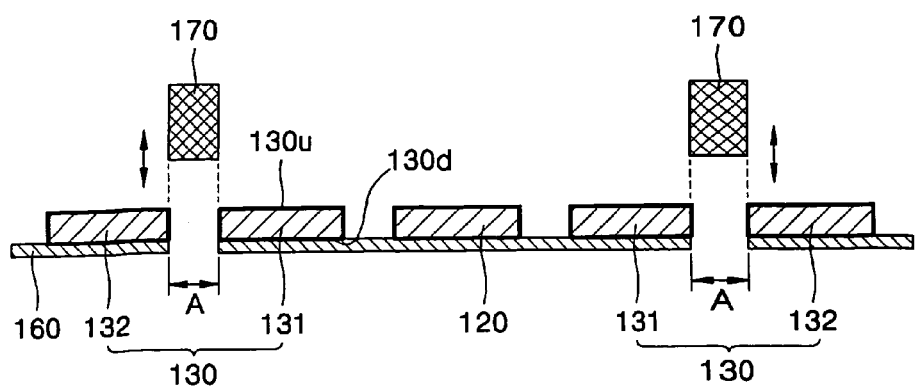
Figure 4E:
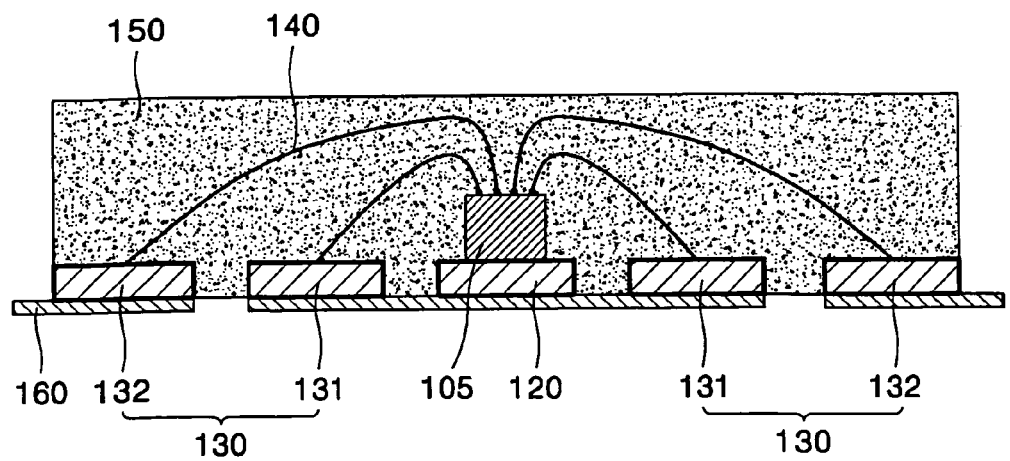
Figure 4F:
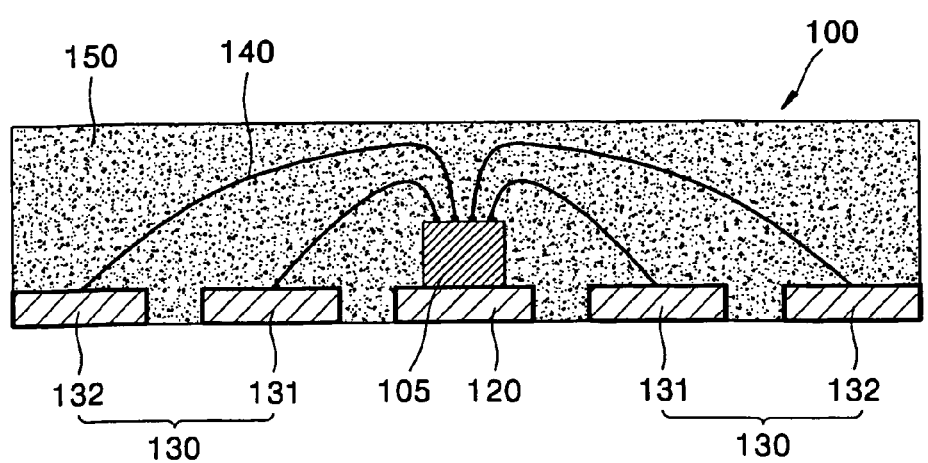

Referring now to FIGS. 3 and 4D, certain designed areas of the lead frame 110 are removed to separate the connection between the adjacent rows of the leads 130 (operation S400). According to the embodiment as shown, connecting areas 130c between the adjacent rows of the leads and adhesive tapes 160 attached in that areas (i.e., in dividing regions "A") are removed preferably by punching with a punch 170 in which the dividing region A is perforated using the punch 170. However, this removing operation can be performed by other known methods such as etching or sputtering method.

Referring to FIGS. 3 and 4E, the semiconductor packaging operation S500 is then performed with the lead frame. The semiconductor packaging operation S500 includes a die attaching operation for mounting a semiconductor chip 105 on the lead frame 110, a wire bonding operation for electrically connecting the semiconductor chip 105 to the lead frame 110 with wires 140, and a molding operation in which the semiconductor chip 105 and the lead frame 110 are molded by encapsulation material 150. By the molding operation, the semiconductor chip 105, lead frame 110, and wires 140 interconnecting the semiconductor chip 105 and multiple rows of leads 130 (formed from operation S400) are protected and secured thereby.

Referring to FIGS. 3 and 4F, the adhesive tape 160 is then removed from the semiconductor package 100 (operation S600). Thereafter, a further operation, such as trimming of dam-bars from the lead frame (not shown), may be performed, This completes the semiconductor packaging process of the invention utilizing the lead frame having multiple rows of leads 130.

Figure 5A:
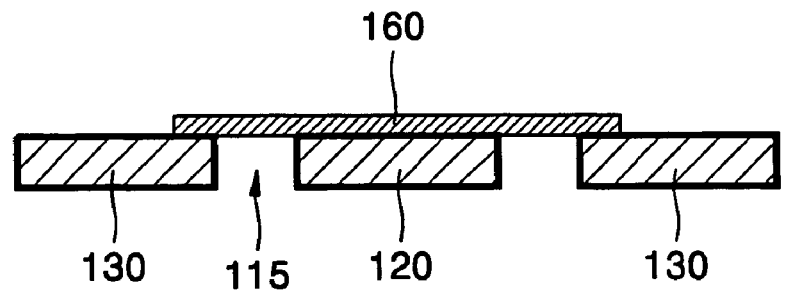
FIGS. 5A and 5B are sectional views similar to FIGS. 4C and 4D, respectively, illustrating alternate embodiments thereof.
Figure 5B:
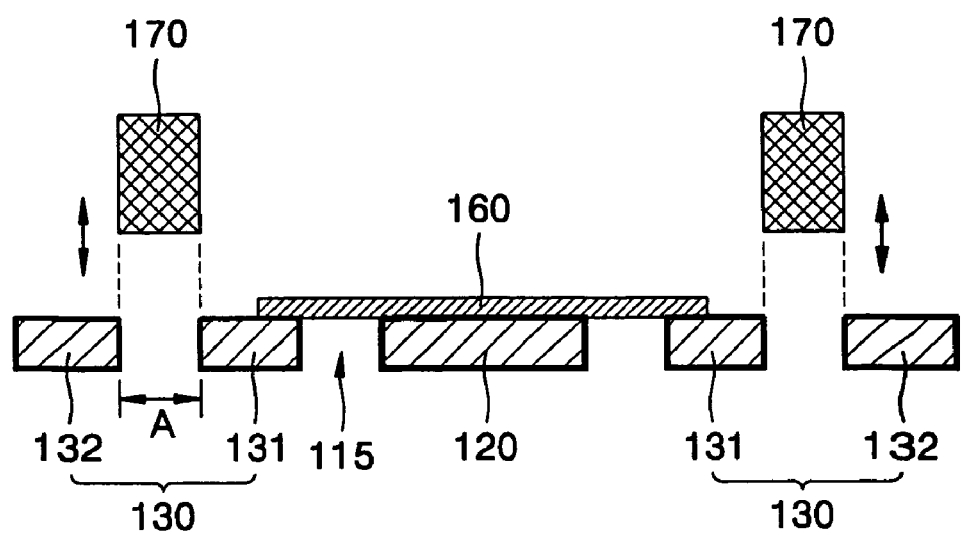

Referring to FIGS. 5A and 5B, the adhesive tape 160 may be attached to the die pad 120 and only portions of the first rows of leads 131 (which is the row located closer to the semiconductor chip 105). In this case, the adhesive tape 160 covers apertures 115 located between the first rows of leads 131 and the die pad 120. But the adhesive tape 160 is not attached to the dividing regions A located between the two adjacent rows of leads 131 and 132. Therefore, when the dividing regions A are perforated by the punch 170, burrs can be easily produced because the leads 130 in the different rows do not securely lie in the same plane and mold flashing can be easily occurred because the distortions of the lead frame near the dividing regions A. Moreover, since the adhesive tape 160 is not securely attached on all of the leads 130, the lead frame can be further distorted or bendable if more than two rows of leads are formed in the lead frame.

Therefore, it is noted that it is preferable to attach the adhesive tape 160 substantially on the entire region of the lead frame 110 such as shown in FIG. 4C. This may help to reduce the mold flash problem.

It is also preferable that the adhesive tape 160 be attached to a rear surface 130d of the lead frame 110 in the taping operation S300 and that the dividing region A be punched from a front surface 130u of the lead frame 110 toward the rear surface 130d in the separation operation S400. This may help the lead frame to maintain its plane shape and regular intervals between the leads during the separation operation S400 by punching.

Figure 6:
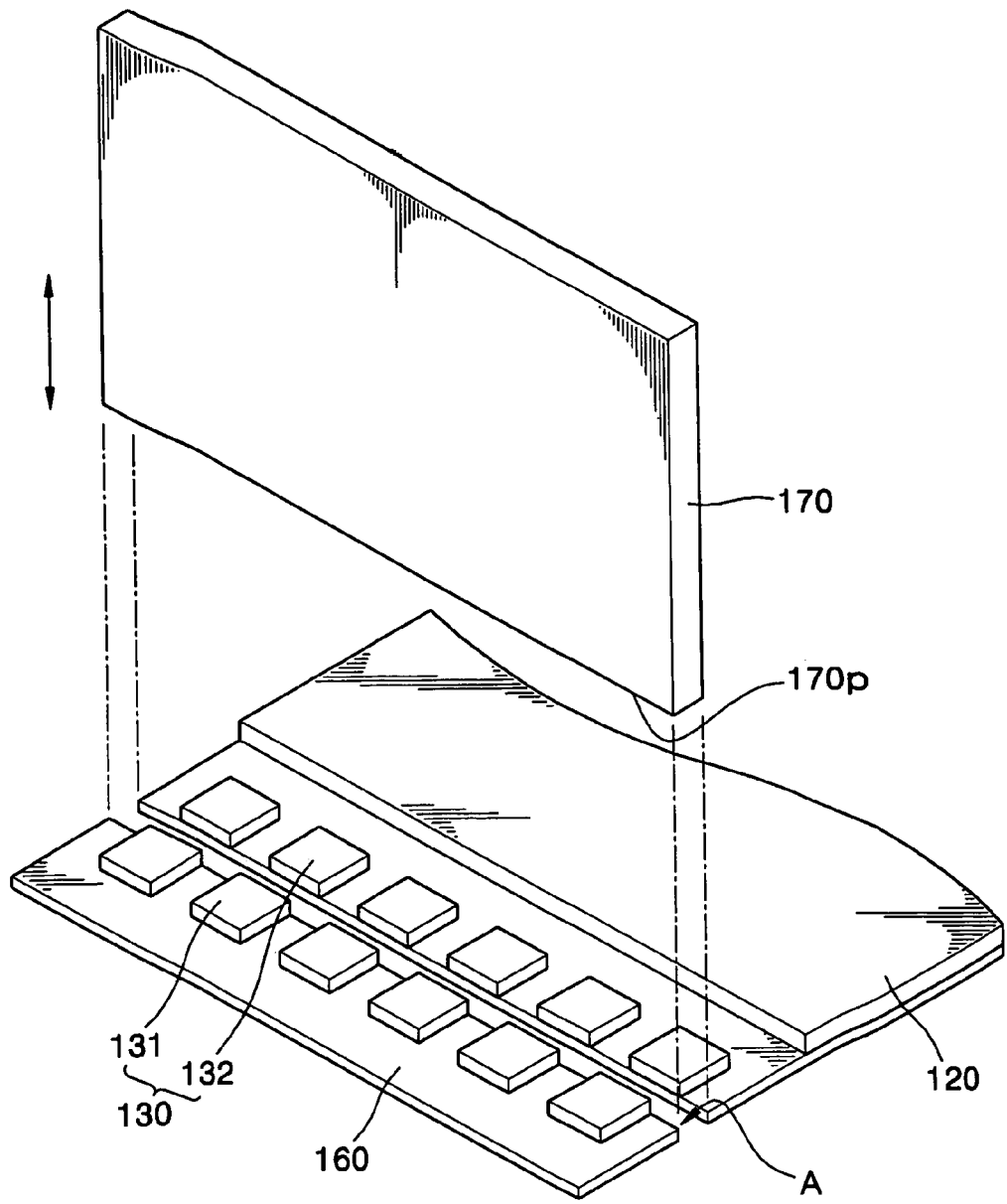
FIG. 6 is an enlarged perspective view illustrating a punching process of the invention in order to separate the leads between neighboring rows with a punch.

As shown in FIG. 6, a distal end surface 170p of the punch 170 may be flat. In this embodiment, the entire area A of two adjacent rows of leads 130 and the adhesive tape 160 is removed.

Figure 7:
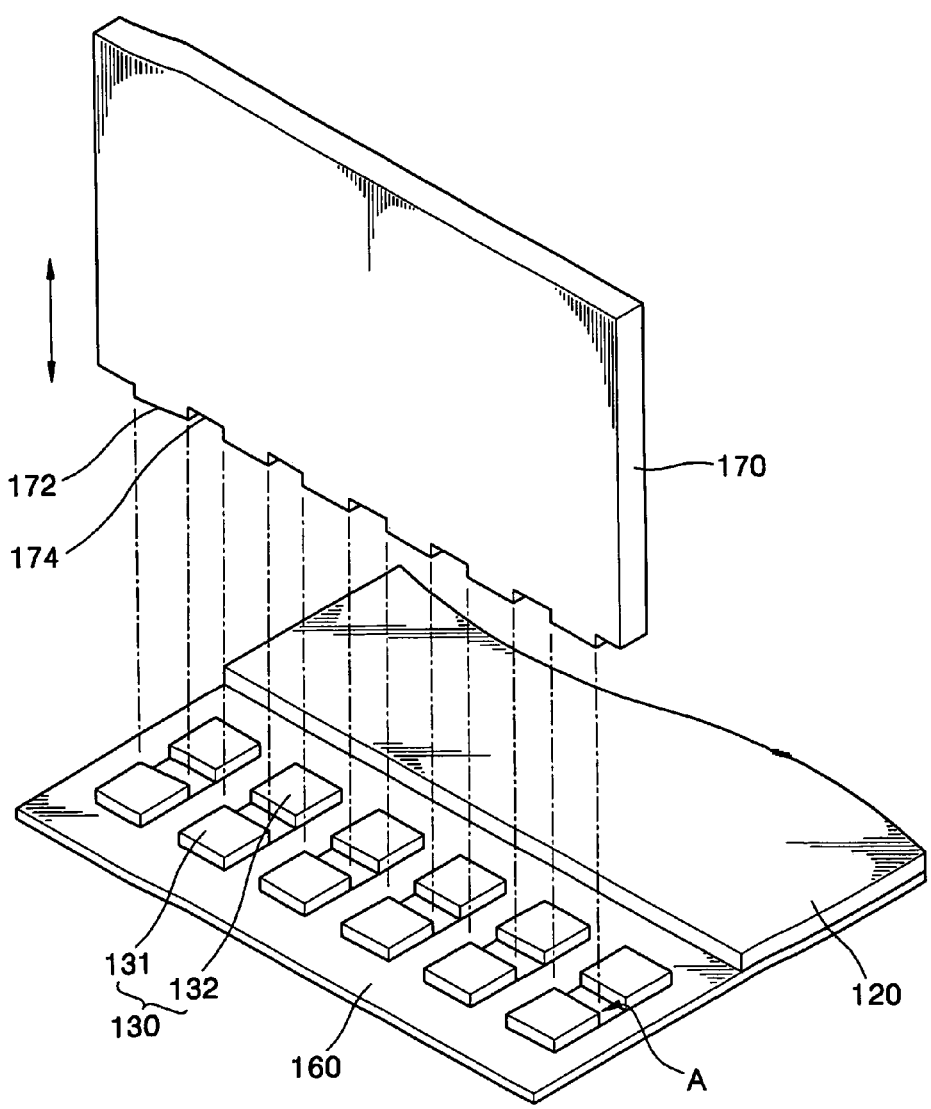
FIG. 7 is an enlarged perspective view similar to FIG. 6, illustrating an alternate punching process for separating the rows of the leads.

However, as shown in FIG. 7, the punch 170 may include protruding portions 172 and recessed portions 174 properly spaced at the distal end portion of the punch 170. Using this punch, only the portions of the leads 130 and adhesive tape 160 located at dividing region A corresponding to the protruding portions 172 are perforated by punching. This embodiment may be advantageous in that the remaining adhesive tape 160 can secure the planar shape of the entire lead frame during the subsequent molding process S500 while restricting production of burrs during the separation process S400. This is preferable particularly when the semiconductor package is produced with a lead frame having more than two rows because the advantage of maintaining flatness of the lead frame is more critical in this case.

Figure 8:
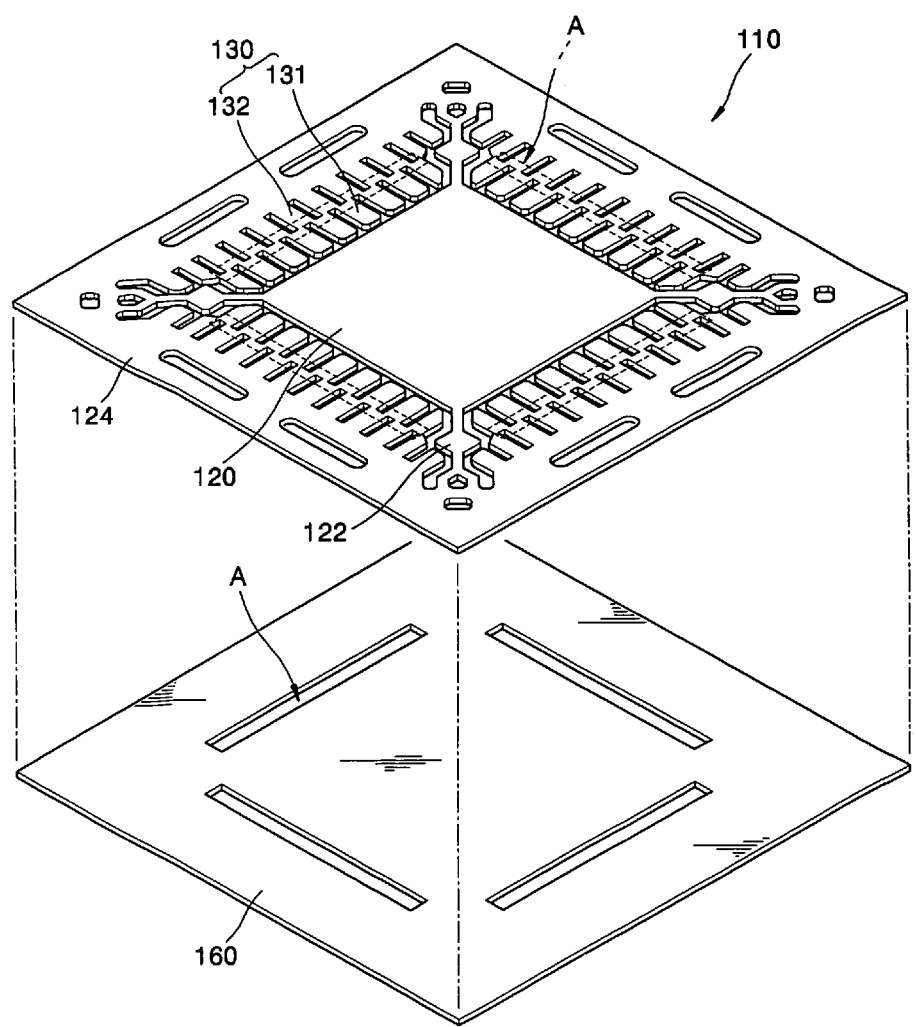
FIG. 8 is an enlarged top view of a lead frame constructed in accordance with the concept of the present invention.

It is preferable that dam-bars 135 (such as shown in FIG. 8) are formed at predetermined locations in the lead frame during the lead frame forming operation S100. With the dam-bars 135 connecting the leads 130 and the like, flatness of the lead frame can be improved, for example, during the separation operation S400. Here, the predetermined locations of the dam-bars 135 may be suitable locations for connecting the adjacent rows of the leads 130 together, locations for connecting at least some of the leads 130 to the die pad 120, or locations existing in the dividing region A. In addition, the dam-bars 135 for interconnecting the leads 130 may be disposed to connect tie bars to the leads 130. The dam-bars are preferably to be removed by the separation process S400.

Describing more specifically with reference to the embodiment shown in FIG. 8, the dam-bars 135 are formed between the leads in the dividing region A in the lead frame forming operation S100 and are removed in the row separation operation S400. With the help of the dam-bars 135 and the adhesive tape 160, the lead frame can maintain its flat shape while each of the leads 130 being properly spaced. Thus, a potential short circuit occurring from contact between neighboring leads can be effectively prevented. As a result, the potential mold flash problem can be further reduce. Provision of dam-bars or similar connecting structures (which can be removed in a later process) is particularly beneficial when packaging with a lead frame having more than two rows of leads.

It is also preferable to provide tie bars 122 in the lead frame forming operation S100 in order to secure the die pad 120 to the lead frame. The tie bars 122 can be preferably removed in the row separation operation S400.

It is also preferable that the leads 130 is formed in the lead frame forming operation S100 to have recessed portions 130c as shown in FIG. 4A. The portions 130c of the leads can be formed in the dividing region A by etching, for example. This can help the subsequent punching process, and generation of burrs during the punching operation can be further reduced.

According to the invention as described above with exemplary embodiments, post molding processes can be reduced by dividing leads of different rows before the semiconductor molding process. Moreover, bonding between the semiconductor chip and the leads can be improved with having mold flashes around the lead frame.

In addition, a semiconductor package having more than two rows of leads can be produced effectively since flatness of the leads and lead frame can be maintained during the semiconductor packaging process utilizing the inventive methods along with the adhesive tape, dam-bars, and other structures as disclosed above. Also, electrical shorts between the leads can be reduced by removing leads located in the dividing regions while the adhesive tape securely covers the leads in the adjacent rows.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A lead frame for a semiconductor package comprising:
   an outer frame formed of a conductive material;
   a die pad disposed adjacent to a central portion of the outer frame;
   a plurality of leads extending from the outer frame and arranged about the die pad, at least some of the plurality of leads being separated in a dividing region and thereby defining at least two rows of leads; and
   an adhesive sheet attached at a lower surface of the lead frame covering at least substantially the die pad and the plurality of leads except the dividing region of the leads.

2. The lead frame of claim 1, wherein the plurality of leads define two rows of leads separated from each other by the dividing region.

3. The lead frame of claim 1, wherein the plurality of leads define three rows of leads separated from each other by the dividing region.

4. The lead frame of claim 1, further comprising tie-bars for connecting the die pad with the outer frame.

5. The lead frame of claim 1, further comprising dam-bars for connecting the leads at predetermined locations of the leads.

* * * * *